(12) United States Patent
Cho et al.

(10) Patent No.: US 10,366,769 B2
(45) Date of Patent: Jul. 30, 2019

(54) NONVOLATILE MEMORY DEVICE AND PROGRAMMING METHOD FOR FAST AND SLOW CELLS THEREOF

(71) Applicant: Samsung Electronics Co., Ltd., Suwon-si, Gyeonggi-do (KR)

(72) Inventors: Yong-sung Cho, Hwaseong-si (KR); Il-han Park, Suwon-si (KR); Jung-yun Yun, Seoul (KR); Youn-ho Hong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/810,741

(22) Filed: Nov. 13, 2017

(65) Prior Publication Data

US 2018/0211715 A1    Jul. 26, 2018

(30) Foreign Application Priority Data

Jan. 26, 2017 (KR) ........................ 10-2017-0012962

(51) Int. Cl.
| | | |
|---|---|---|
| *G11C 16/34* | (2006.01) | |
| *G11C 16/04* | (2006.01) | |
| *G11C 16/10* | (2006.01) | |
| *G11C 11/56* | (2006.01) | |
| *G11C 16/30* | (2006.01) | |
| *G11C 16/08* | (2006.01) | |

(52) U.S. Cl.
CPC ...... *G11C 16/3481* (2013.01); *G11C 11/5628* (2013.01); *G11C 16/0483* (2013.01); *G11C 16/10* (2013.01); *G11C 16/3459* (2013.01); *G11C 16/08* (2013.01); *G11C 16/30* (2013.01); *G11C 2211/5621* (2013.01)

(58) Field of Classification Search
CPC . G11C 16/3481; G11C 16/10; G11C 16/0483; G11C 16/08; G11C 16/30
See application file for complete search history.

(56) References Cited

U.S. PATENT DOCUMENTS 7,492,641 B2     2/2009  Hosono et al.
7,764,542 B2 *   7/2010  Edahiro ............. G11C 16/3427
                                                    365/185.03

(Continued)

FOREIGN PATENT DOCUMENTS

JP          2011-134416 A        7/2011

*Primary Examiner* — Khamdan N. Alrobaie
(74) *Attorney, Agent, or Firm* — Harness, Dickey & Pierce, P.L.C.

(57) ABSTRACT

Provided is a programming method of a nonvolatile memory device, the method comprising the steps of a first programming loop including applying a first verifying voltage to word lines of a plurality of first memory cells for being programmed in a first programming state of a first target threshold voltage and detecting, from among the plurality of first memory cells, a first slow memory cell whose threshold voltage is less than the first verifying voltage, a second programming loop including applying a first program pulse to the first memory cells and applying a second program pulse to the first slow memory cell, a voltage level of the second program pulse of the second program loop being greater than a voltage level of the first program pulse of the second program loop, and a third programming loop.

19 Claims, 12 Drawing Sheets

(56) References Cited

U.S. PATENT DOCUMENTS

| | | | |
|---|---|---|---|
| 7,800,956 B2* | 9/2010 | Lee | G11C 11/5628 |
| | | | 365/185.18 |
| 8,116,131 B2 | 2/2012 | Park et al. | |
| 8,724,395 B2 | 5/2014 | Park et al. | |
| 8,743,606 B2* | 6/2014 | Dutta | G11C 11/5628 |
| | | | 365/185.03 |
| 8,767,475 B2 | 7/2014 | Cho et al. | |
| 9,165,662 B2* | 10/2015 | Kim | G11C 16/12 |
| 2006/0291291 A1* | 12/2006 | Hosono | G11C 16/12 |
| | | | 365/185.22 |
| 2008/0310222 A1* | 12/2008 | Roohparvar | G11C 11/5621 |
| | | | 365/185.03 |
| 2012/0287720 A1* | 11/2012 | Choi | G11C 16/10 |
| | | | 365/185.19 |
| 2013/0028018 A1* | 1/2013 | Cho | G11C 11/5628 |
| | | | 365/185.03 |
| 2013/0039130 A1 | 2/2013 | Lee | |
| 2015/0070987 A1* | 3/2015 | Kim | G11C 16/12 |
| | | | 365/185.03 |
| 2018/0061503 A1* | 3/2018 | Lee | G11C 16/10 |
| 2018/0211715 A1* | 7/2018 | Cho | G11C 16/3481 |

* cited by examiner

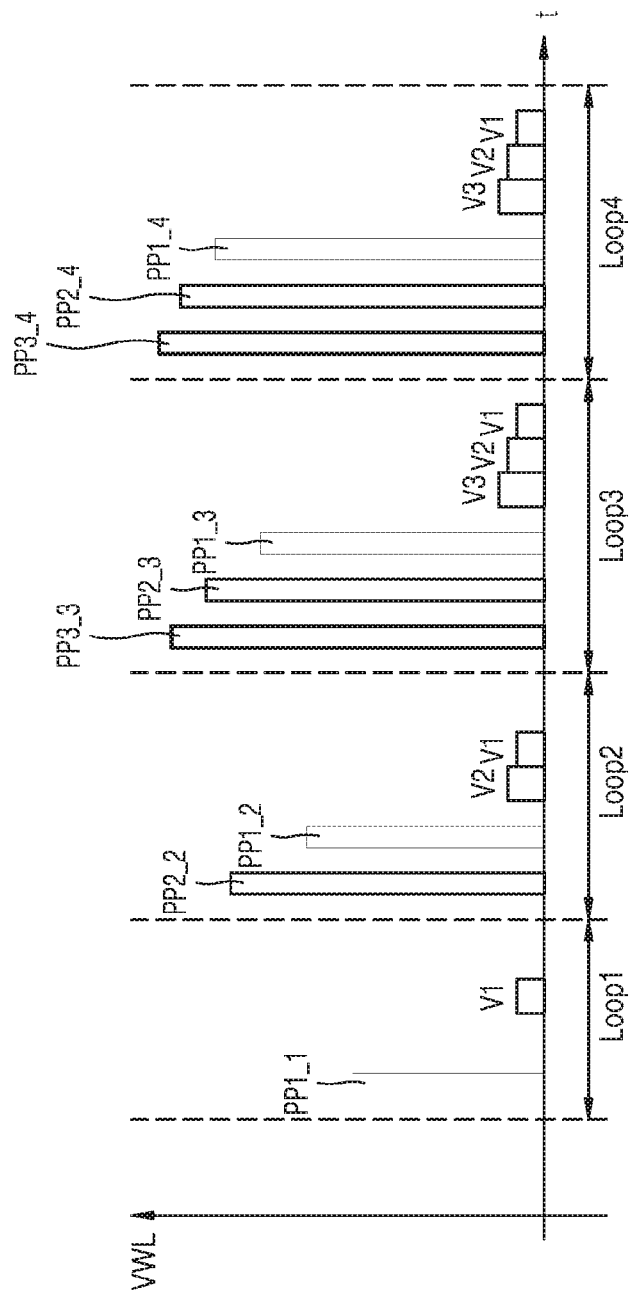

FIG. 7A

| LOOP | PROGRAM PULSE | | | |
|---|---|---|---|---|
| | # OF PROGRAM PULSE | 1st PULSE | 2nd PULSE | 3rd PULSE |
| LOOP1 | 1 | P0, P1, P2 | | |
| LOOP2 | 2 | P0, P1, P2 | P1_S, P2 | |
| LOOP3 | 3 | P0, P1, P2 | P1_S, P2 | P2_S |
| LOOP4 | 3 | P0, P1, P2 | P1_S, P2 | P2_S |

FIG. 7B

| | CELL STATE | BIT LINE VOLTAGE | | |
|---|---|---|---|---|
| | | 1st PULSE | 2nd PULSE | 3rd PULSE |
| P1 | $V_{th} < V1$ | 0 | 0 | Vdd |
| | $V_{th} \geq V1$ | 0 | Vdd | Vdd |
| P2 | $V_{th} < V2$ | 0 | 0 | 0 |
| | $V_{th} \geq V2$ | 0 | 0 | Vdd | ns
NONVOLATILE MEMORY DEVICE AND PROGRAMMING METHOD FOR FAST AND SLOW CELLS THEREOF

CROSS-REFERENCE TO RELATED APPLICATION

This application claims the benefit of Korean Patent Application No. 10-2017-0012962, filed on Jan. 26, 2017, in the Korean Intellectual Property Office, the disclosure of which is incorporated herein in its entirety by reference.

BACKGROUND

Inventive concepts relate to a nonvolatile memory device and a programming method thereof, and more particularly, to a nonvolatile memory device using incremental step pulse programming (ISPP) method and a programming method of the nonvolatile memory device.

Semiconductor memory devices may be classified into volatile memory devices, such as dynamic random-access memories (DRAMs) and/or static RAMs (SRAMs), and nonvolatile memory devices, such as electrically erasable programmable read-only memories (EEPROMs), ferroelectric RAMs (FRAMs), phase-change RAMs (PRAMs), magnetoresistive RAMs (MRAMs), and/or flash memories. Volatile memory devices may lose stored data when power is turned off, whereas nonvolatile memory devices may preserve stored data even when power is turned off.

Devices, such as MP3 players, digital cameras, mobile phones, camcorders, flash cards, and solid-state disks (SSDs), use nonvolatile memory devices. As the number of devices using nonvolatile memory devices as storage devices has increased, storage capacities of nonvolatile memory devices also have increased. One of the methods of increasing the storage capacity of a memory device is a multi-level cell (MLC) method in which a plurality of bits may be stored in one memory cell. In order to recognize data stored in an MLC, a sufficient read margin is desired to be secured. A general programming method of securing a sufficient read margin includes a programming operation based on an incremental step pulse programming (ISPP) scheme in which programming states of memory cells may be verified by using a plurality of verifying voltages whenever a programming voltage pulse is applied to the memory cells. However, even after such a verifying operation is completed, reliability of data stored in the memory cells may be reduced due to memory cell characteristics.

SUMMARY

Inventive concepts provide a nonvolatile memory device and a programming method thereof, whereby reliability of data stored in memory cells may be improved.

According to example embodiment of inventive concepts, there is provided a programming method of a nonvolatile memory device, the method comprising the steps of a first programming loop including applying a first verifying voltage to word lines of a plurality of first memory cells for being programmed in a first programming state of a first target threshold voltage and detecting, from among the plurality of first memory cells, a first slow memory cell whose threshold voltage is less than the first verifying voltage, a second programming loop including applying a first program pulse to the first memory cells and applying a second program pulse to the first slow memory cell, a voltage level of the second program pulse of the second program loop being greater than a voltage level of the first program pulse of the second program loop, and a third programming loop.

According to another example embodiment of inventive concepts, there is provided a nonvolatile memory device including a cell array comprising a plurality of first memory cells for being programmed in a first programming state, a row decoder configured to apply, in a first programming loop, a verifying voltage to word lines of the plurality of first memory cells, and apply, in at least one of a second programming loop and a third programming loop, a first program pulse of a first voltage and a second program pulse of a second voltage greater than the first voltage to the word lines of the first memory cells, a voltage generator configured to generate the verifying voltage, the first voltage, and the second voltage, and transmit the verifying voltage, the first voltage, and the second voltage to the row decoder, a page buffer configured to provide a programming inhibit voltage or a programming bit line voltage to bit lines of the first memory cells and a control logic configured to control sequential execution of the first programming loop, the second programming loop, and the third programming loop. The control logic is configured to control the voltage generator so that a difference between a first voltage of the first program pulse of the third programming loop and a first voltage of the first program pulse of the second programming loop is greater than a difference between a second voltage of the second program pulse of the third programming loop and a second voltage of the second program pulse of the second programming loop.

According to another example embodiment of inventive concepts, there is provided a method including applying a first verify voltage to a plurality of first memory cells, applying a first program pulse of a second programming loop to the plurality of first memory cells, applying a second program pulse of the second programming loop to a first slow memory cell of the plurality of first memory cells in response to the first verify voltage being greater than a threshold voltage of the first slow memory cell, and not applying the second program pulse to a first fast memory cell in response to the first verify voltage being less than or equal to a threshold voltage of the first fast memory cell.

BRIEF DESCRIPTION OF THE DRAWINGS

Embodiments of inventive concepts will be more clearly understood from the following detailed description taken in conjunction with the accompanying drawings in which:

FIGS. 4A and 4B each are a graph showing a voltage that is supplied to a word line according to a programming method according to an example embodiment of inventive concepts;

FIG. 7A is a table showing a program pulse that is applied according to states of a plurality of first memory cells and a plurality of second memory cells in a programming method according to an example embodiment of inventive concepts;

FIG. 7B is a table showing a bit line voltage that is provided according to states of a plurality of first memory cells and a plurality of second memory cells in a programming method according to an example embodiment of inventive concepts;

DETAILED DESCRIPTION OF THE EMBODIMENTS

Hereinafter, example embodiments of inventive concepts will be described in detail with reference to the accompanying drawings.

Figure 1:
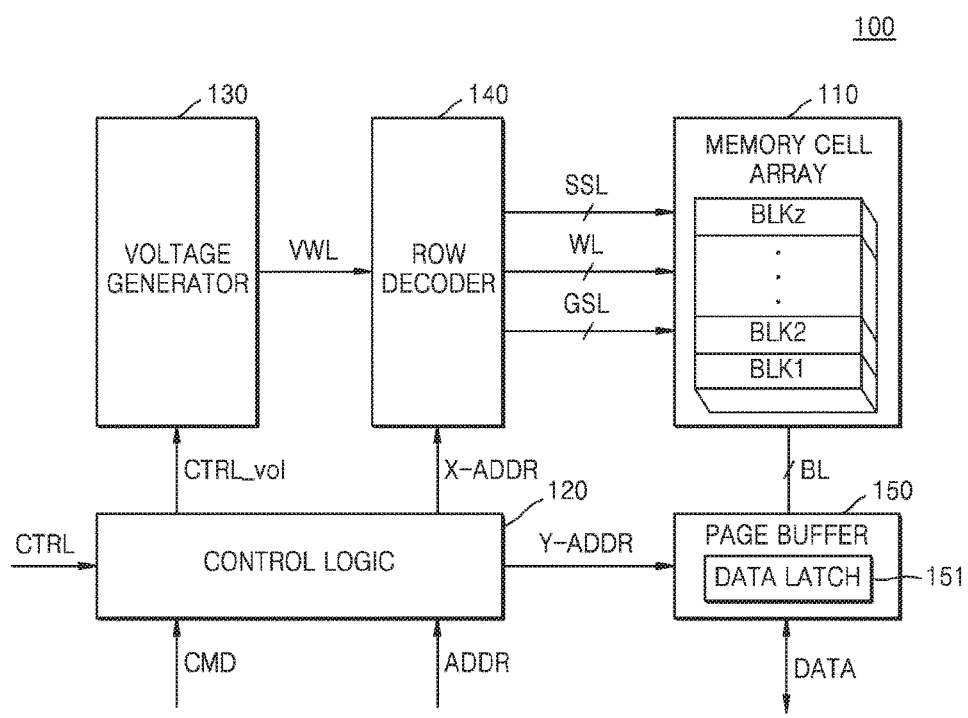
FIG. 1 is a block diagram showing a nonvolatile memory device according to an example embodiment of inventive concepts.

FIG. 1 is a block diagram showing a nonvolatile memory device 100 according to an example embodiment of inventive concepts.

Referring to FIG. 1, the nonvolatile memory device 100 may include a memory cell array 110, a control logic 120, a voltage generator 130, a row decoder 140, and a page buffer 150. Although not shown, the nonvolatile memory device 100 may further include a data input/output circuit and/or an input/output interface.

The memory cell array 110 may include a plurality of memory cells and may be connected to word lines WL, string selection lines SSL, ground selection lines GSL, and bit lines BL. In detail, the memory cell array 110 may be connected to the row decoder 140 through the word lines WL, the string selection lines SSL, and the ground selection lines GSL and may be connected to the page buffer 150 through the bit lines BL.

The memory cell array 110 may include a plurality of blocks BLK1 to BLKz. For example, each of, or at least some of, the plurality of blocks BLK1 to BLKz may have a three-dimensional (3D) structure (or a vertical structure). In detail, each block includes structures that extend in first to third directions. For example, each block includes a plurality of NAND strings (hereinafter, referred to as 'strings') that extend in the third direction. Accordingly, the plurality of strings may be spaced apart by a certain distance from one another in the first and second directions. The blocks BLK1 to BLKz may be selected by the row decoder 140. For example, the row decoder 140 may select a block corresponding to a block address from among the blocks BLK1 to BLKz.

The memory cell array 110 may include at least one of a single-level cell block including single-level cells, a multi-level cell block including multi-level cells, and a triple-level cell block including triple-level cells. For example, some blocks from among a plurality of blocks included in the memory cell array 110 may be single-level cell blocks, and the other blocks may be multi-level cell blocks or triple-level cell blocks.

The control logic 120 may output various control signals for writing data to the memory cell array 110 or reading data from the memory cell array 110 based on a command CMD, an address ADDR, and a control signal CTRL received from the memory controller 200. Accordingly, the control logic 120 may overall control various operations in the nonvolatile memory device 100.

The various control signals output from the control logic 120 may be provided to the voltage generator 130, the row decoder 140, and/or the page buffer 150. The control logic 120 may provide a voltage control signal CTRL_vol to the voltage generator 130. In an example embodiment of inventive concepts, the control logic 120 may generate the voltage control signal CTRL_vol for controlling generation of a verifying voltage and a programming voltage provided to the memory cell array 110 in order to write data to the memory cells.

In an example embodiment, a plurality of programming loops may be executed, e.g. sequentially executed, to program the plurality of memory cells. For example, first to third programming loops may be sequentially executed, but embodiments are not limited thereto.

The control logic 120 may control the voltage generator 130 to generate at least one verifying voltage and at least one program pulse in each programming loop, and the control logic 120 may control the voltage generator 130 to generate a program pulse that has a level, e.g. a voltage level, changed as a programming loop count increases.

The voltage generator 130 may generate various types of voltage for performing programming, read, and erase operations on the memory cell array 110 based on the voltage control signal CTRL_vol. For example, the voltage generator 130 may generate a word line voltage VWL, for example, a program pulse voltage, a verifying voltage, etc. In an example embodiment, the voltage generator 130 may generate a program pulse and a verifying voltage based on the voltage control signal CTRL_vol that have voltage levels changed as a programming loop count increases. When or if a programming loop is executed, a programming method according to an example embodiment may be performed by using an incremental step pulse programming (ISPP) scheme, and the voltage generator 130 may generate a program pulse that has a level higher than a previous programming voltage whenever a programming loop is executed.

The voltage generator 130 may generate a verifying voltage in a first programming loop and may sequentially generate a first program pulse and a second program pulse in each of a second programming loop and a third programming loop. Accordingly, a second program pulse of each programming loop may have a higher voltage level than a first program pulse. A voltage level difference of a first program pulse of the third programming loop and a first program pulse of the second programming loop may be greater than a level difference of a second program pulse of the third programming loop and a second program pulse of the second programming loop.

The row decoder 140 may select some word lines from among the word lines WL in response to a row address X-ADDR received from the control logic 120. In detail, during a programming operation, the row decoder 140 may provide a program pulse to the selected word lines. Additionally, the row decoder 140 may select some string selection lines from among the string selection lines SSL or some ground selection lines from among the ground selection lines GSL in response to the row address X-ADDR received from the control logic 120.

The row decoder 140 may receive at least one verifying voltage and at least one program pulse from the voltage generator 130 with respect to each programming loop, and may provide the at least one verifying voltage and the at least one program pulse to word lines of the plurality of memory cells. Accordingly, the row decoder 140 may provide a verifying voltage to the word lines of the plurality of memory cells in the first programming loop and may provide a first program pulse and a second program pulse to the word lines of the plurality of memory cells in each of the second programming loop and the third programming loop.

The page buffer 150 may be connected to the memory cell array 110 through the bit lines BL, and may select some bit lines from among the bit lines BL in response to a column address Y-ADDR received from the control logic 120. In detail, during a read operation, the page buffer 150 may operate as a sense amplifier and detect data DATA stored in the memory cell array 110. During a programming operation, the page buffer 150 may operate as a write driver and input data DATA. Data DATA may be stored in the memory cell array 110.

The page buffer 150 may store data DATA read from the memory cell array 110 and/or may store data DATA that is to be written to the memory cell array 110. For example, the page buffer 150 may include a plurality of data latches 151, and the plurality of data latches 151 may temporarily store data DATA. In an example embodiment, as will be described later, the at least one data latch which is not used during an ISPP process may temporarily store information regarding whether a memory cell included in the memory cell array 110 is a slow memory cell or a fast memory cell. An operation of distinguishing between a slow memory cell and a fast memory cell will be described later with reference to FIG. 4A.

When or if a program pulse is applied to the word lines selected by the row decoder 140 during a programming operation, the page buffer 150 may apply a bit line voltage, such as a programming inhibit voltage, and a programming bit line voltage to the bit lines BL according to data that is to be programmed. For example, in order to program logic '1', the page buffer 150 may provide a programming inhibit voltage to bit lines. In order to program logic '0', the page buffer 150 may provide a programming bit line voltage to bit lines. In an example embodiment, the programming bit line voltage may be provided as a ground level or 0 V, and the programming inhibit voltage may be provided as a power voltage Vdd. A bit line voltage that is provided to the plurality of memory cells will be described later with reference to FIG. 7A.

In an example embodiment, while the row decoder 140 provides a second program pulse to word lines of a plurality of first memory cells of the memory cell array 110 in each of the second programming loop and the third programming loop, the page buffer 150 may provide a programming inhibit voltage to a bit line of a fast cell of the plurality of first memory cells and may provide a programming bit line voltage to a bit line of a slow cell of the plurality of first memory cells. Additionally, while the row decoder 140 provides the second program pulse to the word lines of the plurality of first memory cells in each of the second programming loop and the third programming loop, the page buffer 150 may provide a programming bit line voltage to bit lines of a plurality of second memory cells of the memory cell array 110. Based on data stored in the page buffer 150, the plurality of first memory cells may refer to memory cells that are to be programmed in a first programming state, and the plurality of second memory cells may refer to memory cells that are to be programmed in a second programming state, which is a state with a target threshold voltage greater than a target threshold voltage of the first programming state. In an example embodiment, the first programming state and the second programming state may be two highest programming states from among a plurality of programming states.

Figure 2:
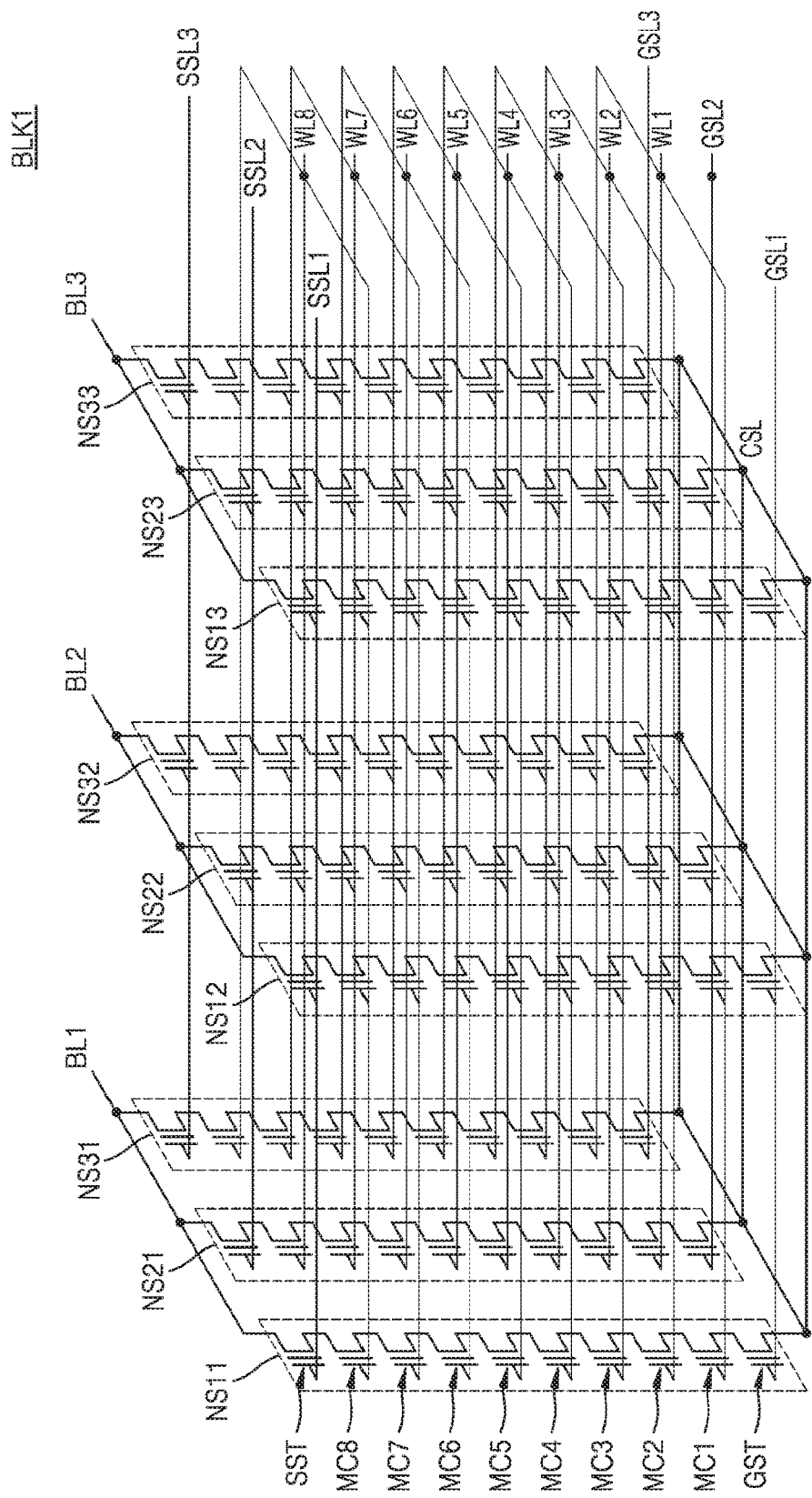
FIG. 2 is a circuit diagram showing an equivalent circuit of a first block of FIG. 1.

FIG. 2 is a circuit diagram showing an equivalent circuit of the first block BLK1 of FIG. 1.

Referring to FIG. 2, the first block BLK1 may be a vertical NAND flash memory, and each of the blocks BLK1 to BLKz of FIG. 1 may have the same form as shown in FIG. 2. The first block BLK1 may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. In this regard, the number of NAND strings, the number of word lines, the number of bit lines, the number of ground selection lines, and the number of string selection lines may be changed in various ways according to embodiments.

The NAND strings NS11, NS21, and NS31 may be provided between the first bit line BL1 and the common source line CSL, the NAND strings NS12, NS22, and NS32 are provided between the second bit line BL2 and the common source line CSL, and the NAND strings NS13, NS23, and NS33 are provided between the third bit line BL3 and the common source line CSL. Each, or at least one, NAND string (for example, NS11) may include a string selection transistor SST, a plurality of memory cells MC1 to MC8, and a ground selection transistor GST that are serially connected. Hereinafter, a NAND string will be referred to as a string for convenience of description.

One column may include strings commonly connected to one bit line. For example, the strings NS11, NS21, and NS31 commonly connected to the first bit line BL1 may correspond to a first column, the strings NS12, NS22, and NS32 commonly connected to the second bit line BL2 may correspond to a second column, and the strings NS13, NS23, and NS33 commonly connected to the third bit line BL3 may correspond to a third column.

One row may include strings connected to one string selection line. For example, the strings NS11, NS12, and NS13 connected to the first string selection line SSL1 may correspond to a first row, the strings NS21, NS22, and NS23 connected to the second string selection line SSL2 may correspond to a second row, and the strings NS31, NS32, and NS33 connected to the third string selection line SSL3 may correspond to a third row.

The string selection transistor SST may be connected to each of the string selection lines SSL1 to SSL3. The plurality of memory cells MC1 to MC8 may be respectively connected to the word lines WL1 to WL8. The ground selection transistor GST may be connected to each of the ground selection lines GSL1 to GSL3. The string selection transistor SST is connected to each of, or at least one of, the bit lines BL1 to BL3, and the ground selection transistor GST is connected to the common source line CSL.

In the example embodiment, the word lines having the same height (for example, WL1) are connected to one another, the string selection lines SSL1 to SSL3 are separated from one another, and the ground selection lines GSL1 to GSL3 are also separated from one another. For example, when or if memory cells that are connected to the first word line WL1 and belong to the strings NS11, NS12, and NS13 are programmed, the first word line WL1 and the first string selection line SSL1 may be selected. However, inventive concepts are not limited thereto, and in another embodiment, the ground selection lines GSL1 to GSL3 may be connected to one another.

Figure 3:
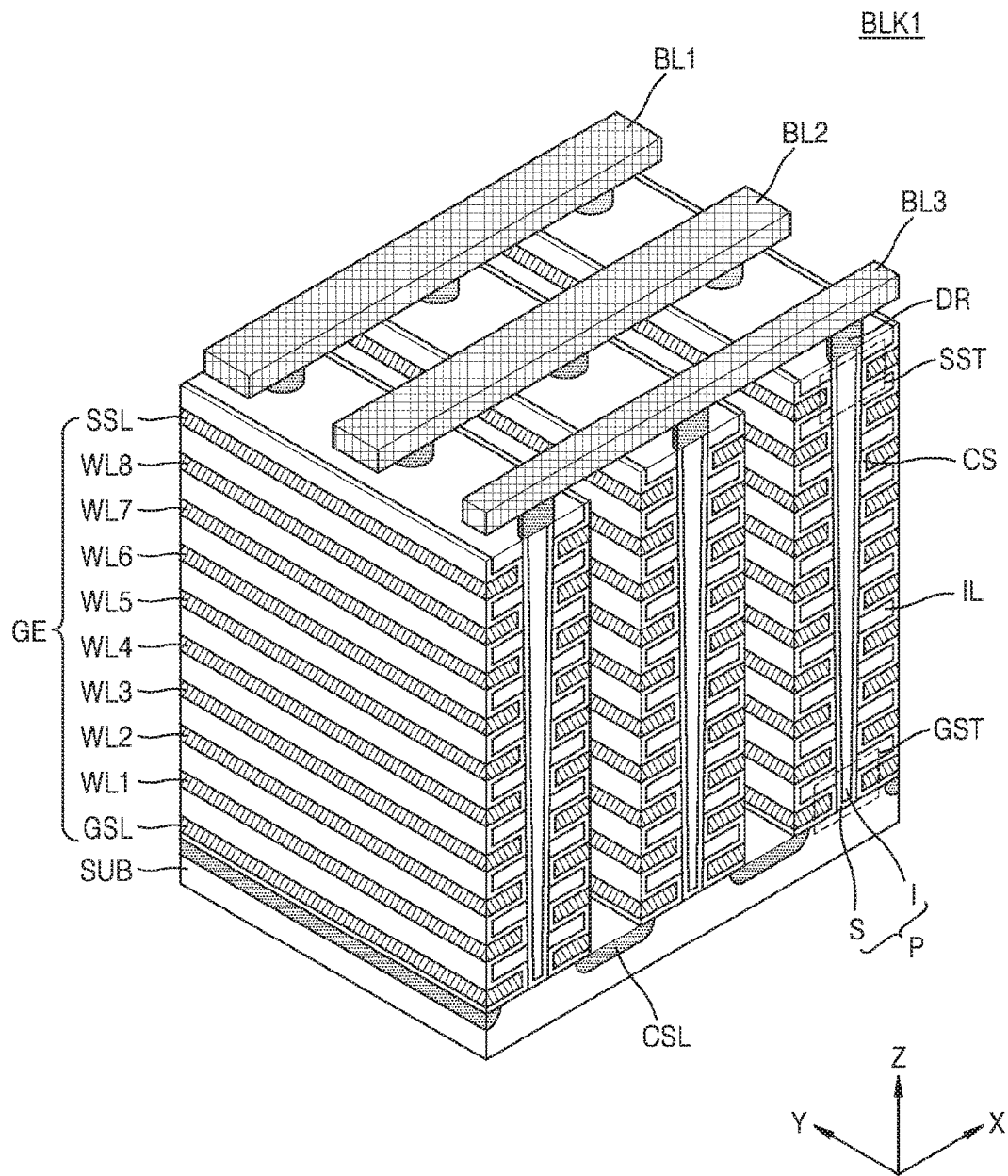
FIG. 3 is a perspective view showing an example of the first block, which is one of the blocks of FIG. 1.

FIG. 3 is a perspective view showing an example of the first block BLK1, which is one of the blocks of FIG. 1.

Referring to FIG. 3, the first block BLK1 may be formed in a direction perpendicular to a substrate SUB. Although the first block BLK1 includes two selection lines GSL and SSL, eight word lines WL1 to WL8, and three bit lines BL1 to BL3 in FIG. 3, the first block BLK1 may actually include fewer or more lines.

The substrate SUB has a first conductivity type (for example, a p-type), and the common source line CSL extends in a first direction (for example, a Y direction) on the substrate SUB and is doped with impurities having a second conductivity type (for example, an n-type). A plurality of insulating films IL that extend in the first direction are sequentially provided in a third direction (for example, a Z direction) on a portion of the substrate SUB between two adjacent common source lines CSL, and are spaced apart by a certain distance from each other in the third direction. For example, the plurality of insulating films IL may include an insulating material such as silicon oxide.

A plurality of pillars P that pass through the plurality of insulating films IL in the third direction and are sequentially arranged in the first direction are provided on a portion of the substrate SUB between two adjacent common source lines CSL. For example, the plurality of pillars P may pass through the plurality of insulating films IL and contact the substrate SUB. In detail, a surface layer S of each of the pillars P may include a silicon material having a first type and may function as a channel region. An inner layer I of each pillar P may include an insulating material such as silicon oxide and/or an air gap.

A charge storage layer CS may be provided along exposed surfaces of the insulating films IL, the pillars P, and the substrate SUB in a portion between two adjacent common source lines CSL. The charge storage layer CS may include a gate insulating layer (or referred to as a 'tunneling insulating layer'), a charge trap layer, and a blocking insulating layer. For example, the charge storage layer CS may include, e.g. may have, an oxide-nitride-oxide (ONO) structure. Also, a gate electrode GE such as each of the selection lines GSL and SSL and the word lines WL1 to WL8 is provided on an exposed surface of the charge storage layer CS in a portion between two adjacent common source lines CSL.

Drains or drain contacts DR are respectively provided on the plurality of pillars P. For example, the drains or the drain contacts DR may include a silicon material doped with impurities having a second conductivity type. The bit lines BL1 to BL3 that extend in a second direction (for example, an X direction) and are spaced apart by a certain distance from each other in the first direction are provided on the drains or the drain contacts DR.

Figure 4A:
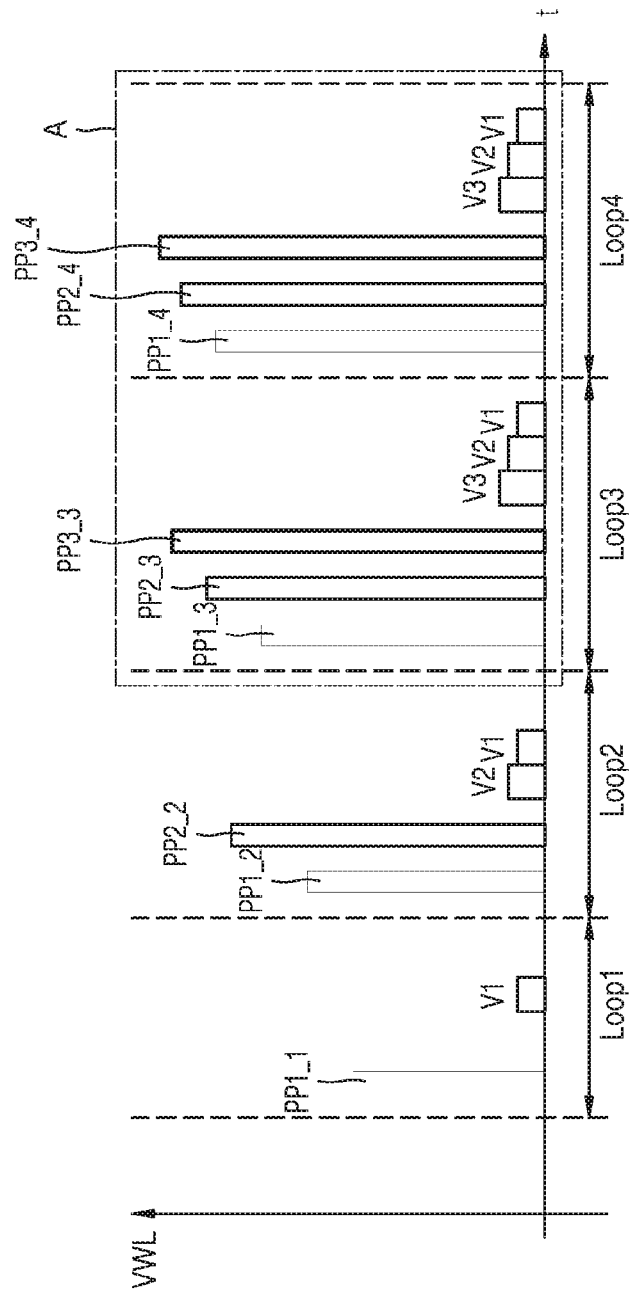
Figure 5:
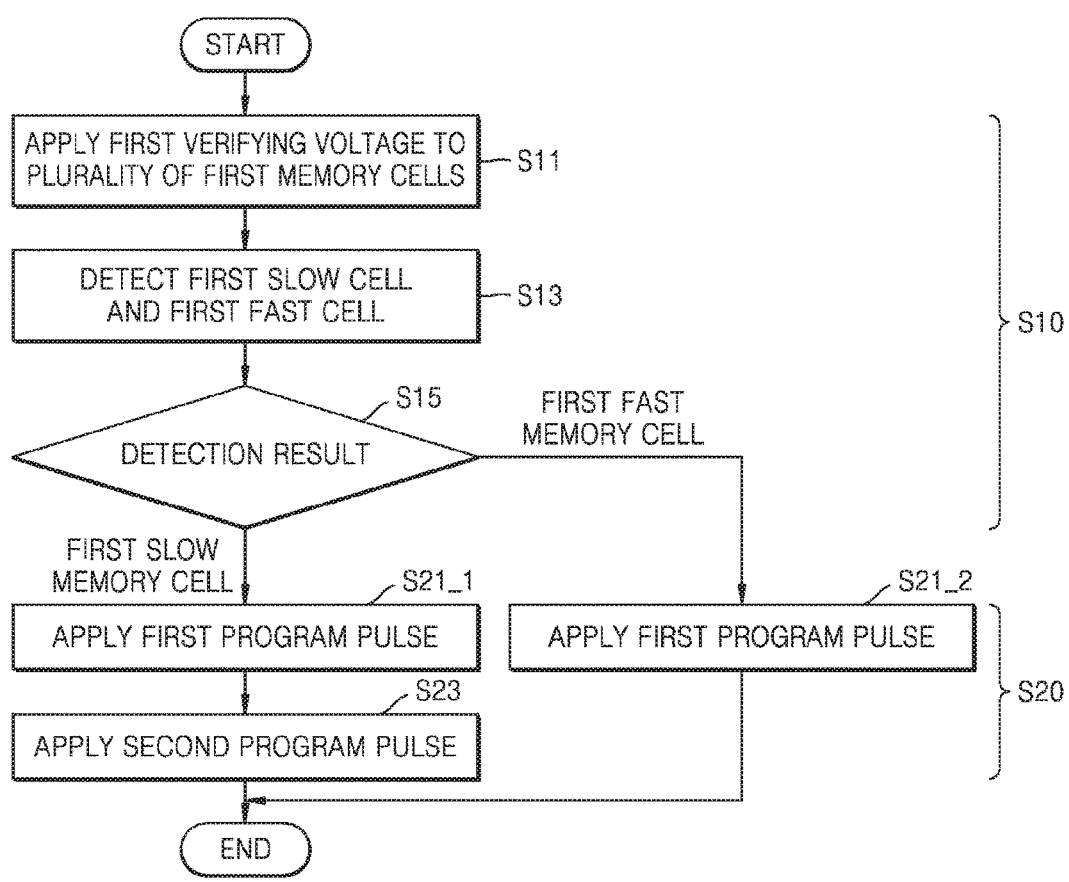
FIG. 5 is a flowchart showing a programming method according to an example embodiment of inventive concepts, and more particularly, operations of executing a first programming loop and a second programming loop.

FIGS. 4A and 4B each are a graph showing a voltage that is supplied to a word line according to a programming method according to an example embodiment of inventive concepts. In this regard, the horizontal axis denotes time t, and the vertical axis denotes a voltage level of word line voltage VWL. FIG. 5 is a flowchart showing a programming method according to an example embodiment of inventive concepts, and more particularly, operations S10 and S20 of executing a first programming loop and a second programming loop of FIG. 4A.

Referring to FIGS. 4A and 5, a method of programming a nonvolatile memory device, according to an example embodiment of inventive concepts, may include a plurality of programming loops. For example, first to fourth programming loops Loop1 to Loop4 may be executed, e.g. sequentially executed. Although at least one programming loop may be executed even before the first programming loop Loop1, and at least one programming loop may be executed even after the fourth programming loop Loop4, embodiments are not limited thereto.

The memory cell array 110 of FIG. 1 may include a plurality of first memory cells for being programmed in a first programming state and a plurality of second memory cells for being programmed in a second programming state. The second programming state may be a programming state with a threshold voltage greater than the threshold voltage of the first programming sate. The plurality of first memory cells and the plurality of second memory cells may be programmed by applying a program pulse that increases with respect to each programming loop to the first memory cells and the second memory cells. In this regard, applying of the program pulse that increases with respect to each programming loop to the first memory cells and the second memory cells refers to providing the program pulse to word lines of the first memory cells and the second memory cells, and at the same time, providing a programming bit voltage to bit lines of the first memory cells and the second memory cells.

While the first programming loop Loop1 is executed in operation S10, a first verifying voltage V1 may be applied to the first memory cells in operation S11. A threshold voltage of each of the first memory cells may be compared with the first verifying voltage V1. According to a comparison result, in operation S13, the memory cell that has a threshold voltage whose voltage level is lower than the first verifying voltage V1 may be detected as a first slow memory cell, and the memory cell that has a threshold voltage whose level is greater than or equal to the first verifying voltage V1 may be detected as a first fast memory cell. A detection result (operation S15) may be stored in at least one of the data latches 151 of the page buffer 150. Even while programming loops after the first programming loop Loop1 are executed, a program pulse may be applied by distinguishing between the first slow memory cell and the first fast memory cell based on the detection result stored in the page buffer 150.

The first verifying voltage V1 may have a lower voltage level than a verifying voltage in the first programming state. For example, the first verifying voltage V1 may be a voltage for verifying that the memory cells are programmed in the highest programming state from among programming states lower than the first programming state. By applying the first verifying voltage V1 to a plurality of memory cells in the first programming loop Loop1, whether a programming state with a threshold voltage less than the threshold voltage of the first programming state has been programmed may be verified, and at the same time, the first memory cells may be divided into first slow memory cells and first fast memory cells. When the programming state with a target threshold less than the target threshold of the first programming state is determined as having been programmed, a programming inhibit voltage may be applied to a bit line of a corresponding memory cell.

Although only the first verifying voltage V1 is shown as being applied to the plurality of memory cells in the first programming loop Loop1, embodiments are not limited thereto, and a verifying voltage having a threshold voltage value in another programming state may be additionally applied thereto.

While the second programming loop Loop2 is executed in operation S20, a first program pulse PP1_2 and a second program pulse PP2_2 may be applied, e.g. sequentially applied to the first slow memory cell in operations S21_1 and S23, and only the first program pulse PP1_2 may be applied to the first fast memory cell in operation S21_2. For example, the second program pulse PP2_2 may not be applied to the first fast memory cell in response to the first verifying voltage V1 being less than or equal to the threshold voltage of the first fast memory cell. In this regard, the second program pulse PP2_2 may have a greater voltage level than the first program pulse PP1_2.

For example, while the second programming loop Loop2 is executed in operation S20, the row decoder 140 of FIG. 1 may sequentially provide the first program pulse PP1_2 and the second program pulse PP2_2 to word lines of the first slow memory cell and the first fast memory cell. When or if the row decoder 140 provides the first program pulse PP1_2, the page buffer 150 of FIG. 1 may provide a programming bit line voltage to both of the first slow memory cell and the first fast memory cell. However, while the row decoder 140 provides the second program pulse PP2_2, the page buffer 150 may provide a programming bit line voltage to the first slow memory cell and may provide a programming inhibit voltage to the first fast memory cell.

Even in the first programming loop Loop1, the row decoder 140 may provide a first program pulse PP1_1 that is a single pulse to word lines of the plurality of memory cells. However, embodiments are not limited thereto, and the row decoder 140 may additionally provide a second program pulse thereto.

Referring to FIG. 4B, when compared with FIG. 4A, while the second programming loop Loop2 is executed, the second program pulse PP2_2 may be applied to the first slow memory cell, and then, and the first program pulse PP1_2 may be applied thereto. Only the first program pulse PP1_2 may be applied to the first fast memory cell. In this regard, the second program pulse PP2_2 may have a higher voltage level than the first program pulse PP1_2.

For example, while the second programming loop Loop2 is executed, the row decoder 140 of FIG. 1 may provide the second program pulse PP2_2 to word lines of the first slow memory cell and the first fast memory cell and then may provide the first program pulse PP1_2 thereto. While the row decoder 140 provides the second program pulse PP2_2, the page buffer 150 of FIG. 1 may provide a programming bit line voltage to the first slow memory cell and may provide a programming inhibit voltage to the first fast memory cell. However, while the row decoder 140 provides the first program pulse PP1_2, the page buffer 150 may provide a programming bit line voltage to both of the first slow memory cell and the first fast memory cell.

Accordingly, referring to FIGS. 4A and 4B, a programming method according to inventive concepts may not be limited to an order in which the first program pulse PP1_2 and the second program pulse PP2_2 are applied while the second programming loop Loop2 is executed.

Figure 6:
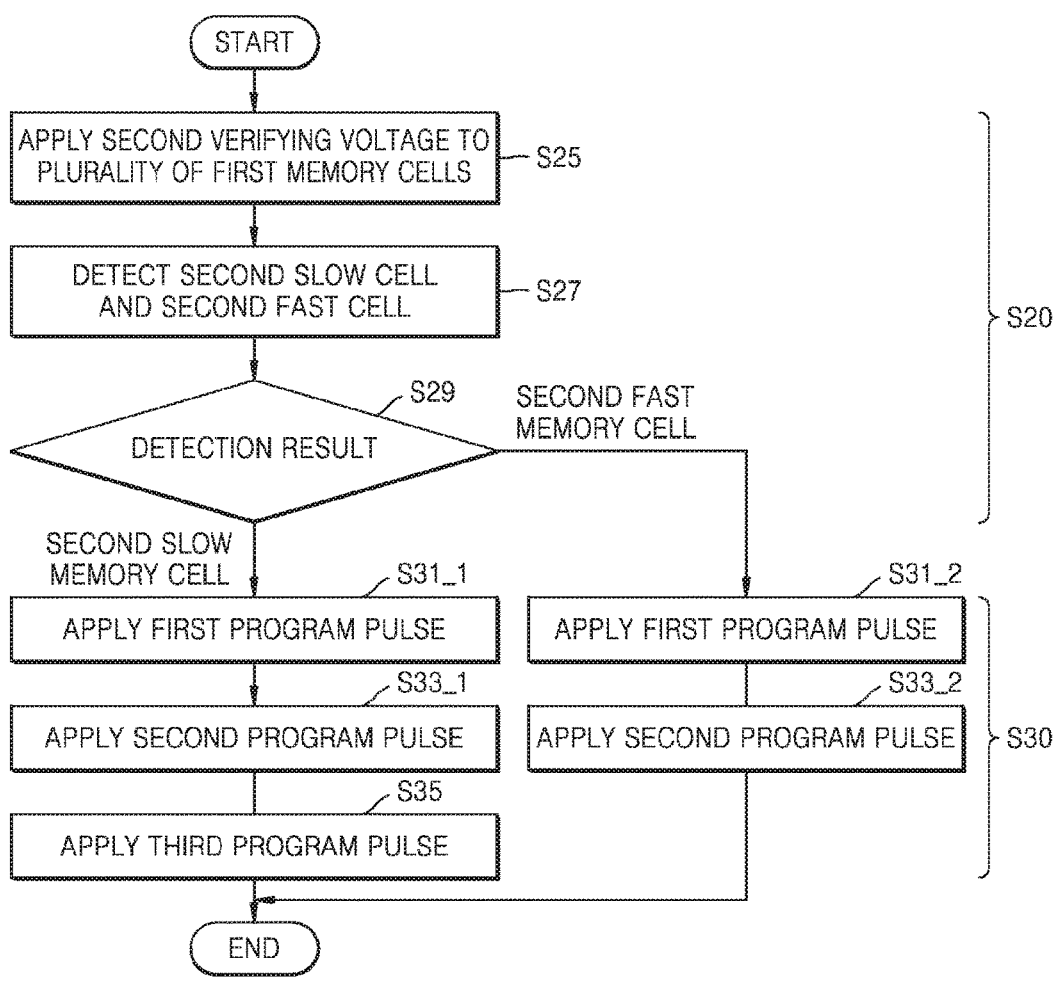
FIG. 6 is a flowchart showing a programming method according to an example embodiment of inventive concepts, and more particularly, operations of executing a second programming loop and a third programming loop.

FIG. 6 is a flowchart showing a programming method according to an example embodiment of inventive concepts, and more particularly, operations S20 and S30 of executing a second programming loop and a third programming loop of FIG. 4A.

Referring to FIGS. 4A and 6, a method of programming a nonvolatile memory device may include a plurality of programming loops. For example, first to fourth programming loops Loop1 to Loop4 may be executed, e.g. sequentially executed.

While the second programming loop Loop2 is executed in operation S20, a second verifying voltage V2 may be applied to the second memory cells in operation S25. In operation S27, by comparing a threshold voltage of each of the second memory cells with the second verifying voltage V2, the memory cell that has a threshold voltage whose voltage level is less than the second verifying voltage V2 may be detected as a second slow memory cell, and the memory cell that has a threshold voltage whose level is greater than or equal to the second verifying voltage V2 may be detected as a second fast memory cell.

The second verifying voltage V2 may have a lower voltage level than a verifying voltage in the second programming state. For example, the second verifying voltage V2 may be a verifying voltage in the first programming state. By applying the second verifying voltage V2 to a plurality of memory cells in the second programming loop Loop2, whether the first programming state has been programmed may be verified, and at the same time, the second memory cells may be divided into second slow memory cells and second fast memory cells. When the first programming state is determined as having been programmed, a program pulse may not be applied to the first memory cells anymore.

Although providing the first verifying voltage V1 and the second verifying voltage V2 to word lines of a plurality of memory cells in the second programming loop Loop2 is shown in FIG. 4A, embodiments are not limited thereto, and if the programming state with a threshold voltage less than the threshold voltage of the first programming state has been programmed, only the second verifying voltage V2 may be provided, or a verifying voltage in another programming state may be additionally provided.

While the third programming loop Loop3 is executed in operation S30, a first program pulse PP1_3, a second program pulse PP2_3, and a third program pulse PP3_3 may be applied, e.g. sequentially applied, to the second slow memory cell in operations S31_1, S33_1, and S35, and the first program pulse PP1_3 and the second program pulse PP2_3 may be sequentially applied to the second fast memory cell in operations S31_2 and S33_2.

For example, while the third programming loop Loop3 is executed in operation S30, the row decoder 140 of FIG. 1 may sequentially provide the first program pulse PP1_3, the second program pulse PP2_3, and the third program pulse PP3_3 to word lines of the second slow memory cell and the second fast memory cell. When or if the row decoder 140 provides the first program pulse PP1_3 and the second program pulse PP2_3, the page buffer 150 of FIG. 1 may provide a programming bit line voltage to both of the first slow memory cell and the first fast memory cell. On the other hand, while the row decoder 140 provides the third program pulse PP3_3, the page buffer 150 may provide a programming bit line voltage to the second slow memory cell and may provide a programming inhibit voltage to the second fast memory cell. For example, the third program pulse PP3_3 may not be applied to the second fast memory cell in response to the second verifying voltage V2 being less than or equal to the threshold voltage of the second fast memory cell.

The second program pulse PP2_3 may have a greater voltage level than the voltage level of the first program pulse PP1_3, and the third program pulse PP3_3 may have a greater voltage level than the voltage level of the second program pulse PP2_3. The first program pulse PP1_3, the second program pulse PP2_3, and the third program pulse PP3_3 of the third programming loop Loop3 may have a higher voltage level than the first program pulse PP1_2, the second program pulse PP2_2, and the third program pulse PP3_2 of the second programming loop Loop2, respectively.

In the operation of executing the third programming loop Loop3 (operation S30), when applying of the first program pulse PP1_3, the second program pulse PP2_3, and the third program pulse PP3_3 is completed, the first verifying voltage V1, the second verifying voltage V2, and a third verifying voltage V3 may be provided to word lines of a plurality of memory cells. The third verifying voltage V3 may be a verifying voltage in the second programming state. Accordingly, the first memory cells may determine completion of programming based on the second verifying voltage V2, and the second memory cells may determine completion of programming based on the third verifying voltage V3.

Even in the fourth programming loop Loop4, a similar operation to the third programming loop Loop3 may be performed. While the fourth programming loop Loop4 is executed, a first program pulse PP1_4, a second program pulse PP2_4, a third program pulse PP3_4 may be applied, e.g. sequentially applied, to the second slow memory cell, and the first program pulse PP1_4 and the second program pulse PP2_4 may be sequentially applied to the second fast memory cell.

Referring to FIG. 4B again, while the third programming loop Loop3 is executed, the third program pulse PP3_3, the second program pulse PP2_3, and the first program pulse PP1_3 may be sequentially applied to the second slow memory cell, and the second program pulse PP2_3 may be applied to the second fast memory cell and then the first program pulse PP1_3 may be applied thereto.

For example, while the third programming loop Loop3 is executed, the row decoder 140 of FIG. 1 may sequentially provide the third program pulse PP3_3, the second program pulse PP2_3, and the first program pulse PP1_3 to word lines of the second slow memory cell and the second fast memory cell. While the row decoder 140 provides the third program pulse PP3_2, the page buffer 150 of FIG. 1 may provide a programming bit line voltage to the second slow memory cell and may provide a programming inhibit voltage to the second fast memory cell. However, while the row decoder 140 provides the first program pulse PP1_3 after providing the second program pulse PP2_3, the page buffer 150 may provide a programming bit line voltage to both of the first slow memory cell and the first fast memory cell.

Even in the fourth programming loop Loop4, a similar operation to the third programming loop Loop3 may be performed. While the fourth programming loop Loop4 is executed, the third program pulse PP3_4, the second program pulse PP2_4, and the first program pulse PP1_4 may be sequentially applied to the second slow memory cell, and the second program pulse PP2_4 may be applied to the second fast memory cell and then the first program pulse PP1_4 may be applied thereto.

Accordingly, referring to FIGS. 4A and 4B, a programming method according to inventive concepts may not be limited to an order in which the first program pulse PP1_3, the second program pulse PP2_3, and the third program pulse PP3_3 are applied while the third programming loop Loop3 is executed. Although sequentially applying the first program pulse PP1_3, the second program pulse PP2_3, and the third program pulse PP3_3 is shown in FIG. 4A, and sequentially applying the third program pulse PP3_3, the second program pulse PP2_3, and the first program pulse PP1_3 is sequentially shown in FIG. 4B, each is an example embodiment, and embodiments are not limited thereto. For example, the second program pulse PP2_3, the first program pulse PP1_3, and the third program pulse PP3_3 may be sequentially applied. Additionally, the programming method according to inventive concepts may not be limited to an order in which the first program pulse PP1_4, the second program pulse PP2_4, and the third program pulse PP3_4 are applied while the fourth programming loop Loop4 is executed. Although sequentially applying the first program pulse PP1_4, the second program pulse PP2_4, and the third program pulse PP3_4 is shown in FIG. 4A, and sequentially applying the third program pulse PP3_4, the second program pulse PP2_4, and the first program pulse PP1_4 is sequentially shown in FIG. 4B, each is an example embodiment, and embodiments are not limited thereto.

FIG. 7A is a table showing a program pulse that is applied according to states of a plurality of first memory cells and a plurality of second memory cells in a programming method according to an example embodiment of inventive concepts. FIG. 7B is a table showing a bit line voltage that is provided according to states of a plurality of first memory cells and a plurality of second memory cells in a programming method according to an example embodiment of inventive concepts.

Referring to FIGS. 7A and 7B, in a first programming loop Loop1, a first program pulse may be applied to all of a plurality of first memory cells P1, a plurality of second memory cells P2, and memory cells P0 for being programmed in a programming state lower than a first programming state, for example, a plurality of memory cells that have not been programmed yet.

In a second programming loop Loop2, the first program pulse may be applied to the plurality of memory cells that have not been programmed yet. Accordingly, the first program pulse may also be applied to a memory cell for having a programming state with a threshold voltage less than the threshold voltage of the first programming state. Following the first program pulse, a second program pulse may be additionally applied to a first slow memory cell P1_S. The second program pulse may be applied to the plurality of second memory cells P2 as well as the first slow memory cell P1_S.

That a certain program pulse may be applied to a certain memory cell means that the certain program pulse is applied to a word line of the certain memory cell and at the same time, a programming bit line voltage is applied to a bit line of the certain memory cell. For example, in the case of the first slow memory cell P1_S whose threshold voltage has a lower level than a first verifying voltage V1 from among the plurality of first memory cells P1, when the first program pulse is applied to a word line, 0 V may be provided to a bit line. In this regard, 0 V is merely an example voltage level of the programming bit line voltage, and embodiments are not limited thereto. In the case of a first fast memory cell P1_F whose threshold voltage has a higher level than the first verifying voltage V1 from among the first memory cells P1, when the first program pulse is applied to a word line, a programming inhibit voltage Vdd may be provided to a bit line. In this regard, an example voltage level of the programming inhibit voltage Vdd is shown as a power voltage, but embodiments are not limited thereto.

In a third programming loop Loop3, the first program pulse may be applied to all of the memory cells that have not been programmed yet, and the second program pulse may be further applied to the first slow memory cell P1_S and the second memory cells P2. For example, in the case of first slow memory cells P1_S, when or if the second program pulse is applied to word lines, 0 V may be provided to bit lines. In the case of first fast memory cells P1_F, when the second program pulse is applied to word lines, the programming inhibit voltage Vdd may be provided to bit lines.

A third program pulse may be additionally applied to a second slow memory cell P2_S. For example, in the case of second slow memory cells P2_S whose threshold voltage has a lower level than a second verifying voltage V2 from among the second memory cells P2, when the third program pulse is applied to word lines, 0 V may be provided to bit lines. In the case of second fast memory cells P2_F whose threshold voltage has a greater level than the second verifying voltage V2 from among the second memory cells P2, when the third program pulse PP3_2 is applied to word lines, the programming inhibit voltage Vdd may be provided to bit lines.

In a fourth programming loop Loop4, the first program pulse may be applied to a memory cell that has not been programmed yet, and the second program pulse may be further applied to the first slow memory cell P1_S and the second memory cells P2. The third program pulse may be additionally applied to the second slow memory cell P2_S.

Although the fourth programming loop Loop4 has been described as being executed in a similar manner to the third programming loop Loop3, embodiments are not limited thereto. When the first programming state and a second programming state are two highest programming states from among a plurality of programming states, the fourth programming loop Loop4 may be executed in a similar manner to the third programming loop Loop3. Otherwise, in the fourth programming loop Loop4, a programming operation regarding a programming state with a threshold voltage greater than the threshold voltage of the second programming state may be performed.

Figure 8A:
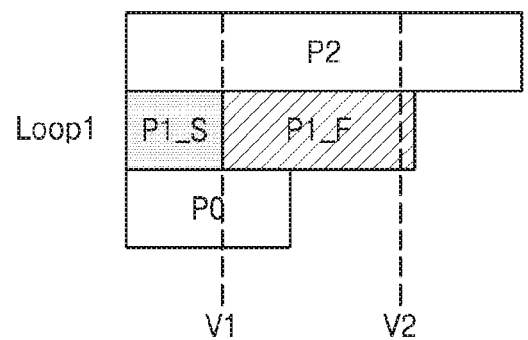
FIGS. 8A to 8C each are a diagram showing threshold voltage distribution increases of a plurality of first memory cells and a plurality of second memory cells during execution of first to third programming loops in an example embodiment of inventive concepts.
Figure 8B:
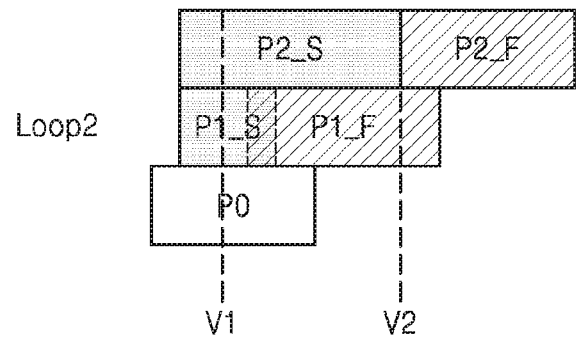
Figure 8C:
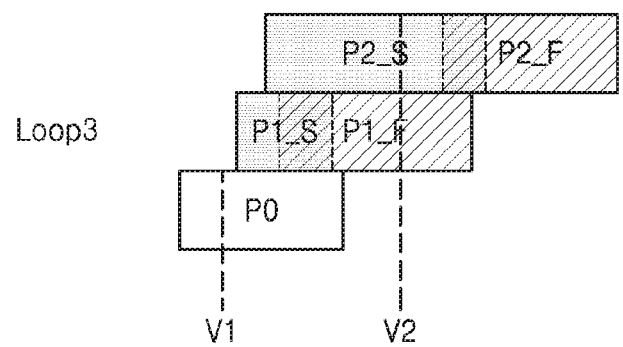

FIGS. 8A to 8C each are a diagram showing threshold voltage distribution increases of a plurality of first memory cells and a plurality of second memory cells during execution of first to third programming loops in an example embodiment of inventive concepts. FIGS. 8A to 8C show threshold voltage distributions of the plurality of first memory cells and the plurality of second memory cells after execution of first to third programming loops Loop1 to Loop3, respectively.

Referring to FIGS. 8A to 8C, in the first programming loop Loop1, a first slow memory cell P1_S and a first fast memory cell P1_F may be distinguished based on a first verifying voltage.

Comparing FIGS. 8A and 8B, in the second programming loop Loop2, a width, or size, of a threshold voltage increase of the first slow memory cell P1_S may be greater than a size of a threshold voltage increase of the first fast memory cell P1_F. Threshold voltages of the first slow memory cell P1_S and the first fast memory cell P1_F may partially overlap each other. The size of the threshold voltage increase of the first slow memory cell P1_S may be similar to a size of a threshold voltage increase of the second memory cells P2. In the second programming loop Loop2, a second slow memory cell P2_S and a second fast memory cell P2_F may be distinguished based on a second verifying voltage.

Comparing FIGS. 8B and 8C, in the third programming loop Loop3, a size of a threshold voltage increase of the first slow memory cell P1_S may be greater than a size of a threshold voltage increase of the first fast memory cell P1_F. Threshold voltages of the first slow memory cell P1_S and the first fast memory cell P1_F may partially overlap each other, and an overlapping degree of the threshold voltages after execution of the third programming loop Loop3 may be greater than an overlapping degree of the threshold voltages after execution of the second programming loop Loop2.

Further, in the third programming loop Loop3, a size of a threshold voltage increase of the second slow memory cell P2_S may be greater than a size of a threshold voltage increase of the second fast memory cell P2_F, and threshold voltages of the second slow memory cell P2_S and the second fast memory cell P2_F may partially overlap each other. The size of the threshold voltage increase of the first slow memory cell P1_S may be similar to the size of the threshold voltage increase of the second fast memory cell P2_F.

In a programming loop after execution of the third programming loop Loop3, for example, a fourth programming loop, an overlapping degree of threshold voltages of the first slow memory cell P1_S and the first fast memory cell P1_F may be increased when compared with the third programming loop Loop3. Further, an overlapping degree of threshold voltages of the second slow memory cell P2_S and the second fast memory cell P2_F may also be increased. When a threshold voltage of memory cells P0 for having a programming state with a threshold voltage less than the threshold voltage of the first programming state becomes greater than a first verifying voltage V1 in the fourth programming loop, a programming operation regarding the memory cells P0 having a programming state lower than the first programming state may not be performed in programming loops that are executed after the fourth programming loop.

In a nonvolatile memory device according to an example embodiment of inventive concepts and a programming method thereof, a program pulse is applied by distinguishing between a slow memory cell and a fast memory cell in one programming loop, and accordingly, a size of threshold voltage dispersion may be effectively narrowed. Further, since a plurality of program pulses are applied in one programming loop, a threshold voltage may be effectively increased in one programming loop. For example, the number of programming loops required to complete a programming operation may decrease.

Figure 9A:
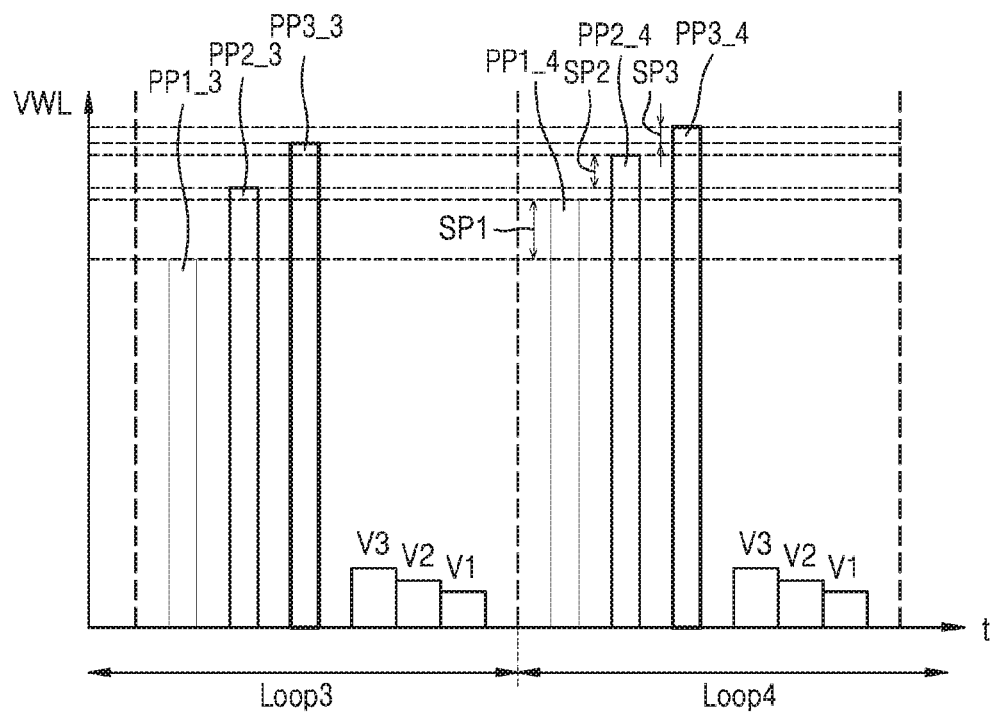
FIG. 9A is a graph showing a voltage that is supplied to a word line according to a programming method according to an example embodiment of inventive concepts and is an enlarged graph showing portion A of FIG. 4A.
Figure 9B:
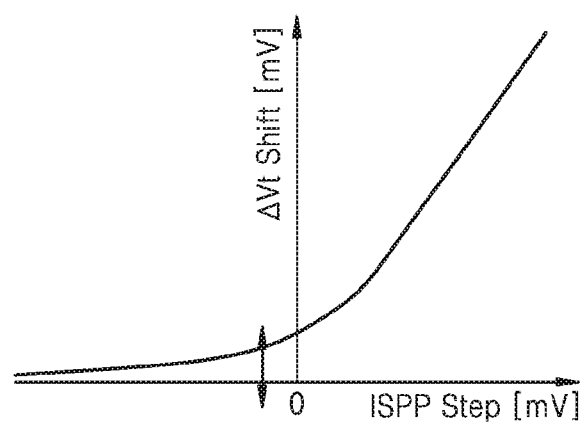
FIG. 9B is a graph showing a threshold voltage change of a memory cell according to an increase of a program pulse.

FIG. 9A is a graph showing a voltage that is supplied to a word line according to a programming method according to an example embodiment of inventive concepts and is an enlarged graph showing portion A of FIG. 4A. FIG. 9B is a graph showing a threshold voltage change of a memory cell according to an increase of a program pulse.

Referring to FIGS. 4A and 9A, in the third programming loop Loop3, the level may become increasingly greater in a direction from the first program pulse PP1_3 to the third program pulse PP3_3. Also, in the fourth programming loop Loop4, the level may become increasingly high in a direction from the first program pulse PP1_4 to the third program pulse PP3_4.

In this regard, a difference between the first program pulse PP1_4 of the fourth programming loop Loop4 and the first program pulse PP1_3 of the third programming loop Loop3 may be referred to as a first step voltage SP1, a difference between the second program pulse PP2_4 of the fourth programming loop Loop4 and the second program pulse PP2_3 of the third programming loop Loop3 may be referred to as a second step voltage SP2, and a difference between the third program pulse PP3_4 of the fourth programming loop Loop4 and the third program pulse PP3_3 of the third programming loop Loop3 may be referred to as a third step voltage SP3. The first step voltage SP1 may be greater than the second step voltage SP2, and the second step voltage SP2 may be greater than the third step voltage SP3.

Additionally, a voltage level difference between the first program pulse PP1_3 of the third programming loop Loop3 and the first program pulse PP1_2 of the second programming loop Loop2 may be greater than a voltage level difference between the second program pulse PP2_3 of the third programming loop Loop3 and the second program pulse PP2_2 of the second programming loop Loop2, and such a tendency may be applied to a programming loop after the fourth programming loop Loop4.

Although FIG. 9A is an enlarged graph showing portion A of FIG. 4A, relationships between a third step voltage, a second step voltage, and a first step voltage may also be applied, as the same as described with reference to FIG. 9A, between the third program pulse PP3_3, the second program pulse PP2_3, and the first program pulse PP1_3 of the third programming loop Loop3, and the third program pulse PP3_4, the second program pulse PP2_4, and the first program pulse PP1_4 of the fourth programming loop Loop4.

Referring to FIGS. 9A and 9B, the first program pulse PP1_4 and the second program pulse PP2_4 of the fourth programming loop Loop4 may have a lower voltage level than the voltage level of the third program pulse PP3_3 of the third programming loop Loop3, and the first program pulse PP1_4 of the fourth programming loop Loop4 may have a voltage level lower level than the voltage level of the second program pulse PP2_3 of the third programming loop Loop3. Referring to FIG. 9B, even though an increase of a program pulse has a negative value, a threshold voltage change of a memory cell has a positive value, and accordingly, a threshold voltage of a plurality of memory cells that have not been programmed may increase during application of the first program pulse PP1_4 and the second program pulse PP2_4 of the fourth programming loop Loop4.

Although each programming loop includes only one program pulse or a plurality of program pulses, a comparative example including a plurality of program pulses in which all of the plurality of program pulses increase in a constant manner as much as a specific (or alternatively predetermined) value in each programming loop will be assumed. According to an example embodiment of inventive concepts, since one programming loop includes a plurality of program pulses, the number of programming loops required to complete programming every programming state may decrease, and as a result, the total amount of time for programming a plurality of memory cells may decrease. Further, according to an example embodiment, since a width of pulse (a size of step voltage) that increases in each programming loop decreases in a direction from a first program pulse to a third program pulse, a voltage level of a program pulse at the final programming loop in which programming is completed, for example, a greater level (e.g. a maximum level) of program pulse, decreases.

As the voltage level of the program pulse at the final programming loop, dispersion of threshold voltages in an erase state may increase. When the dispersion of threshold voltages in the erase state increases, the threshold voltage in the erase state and a threshold voltage in a programming state may overlap, e.g. partially overlap, each other, and in spite of application of a verifying voltage, the erase state and the programming state may be difficult to distinguish. Accordingly, according to an example embodiment, the voltage level of the program pulse at the final programming loop of program pulse becomes low so that the threshold voltage in the erase state and the threshold voltage in the programming state may be prevented from, or reduced in likelihood from, overlapping each other, and thus, reliability of a nonvolatile memory device may be obtained.

Figure 10:
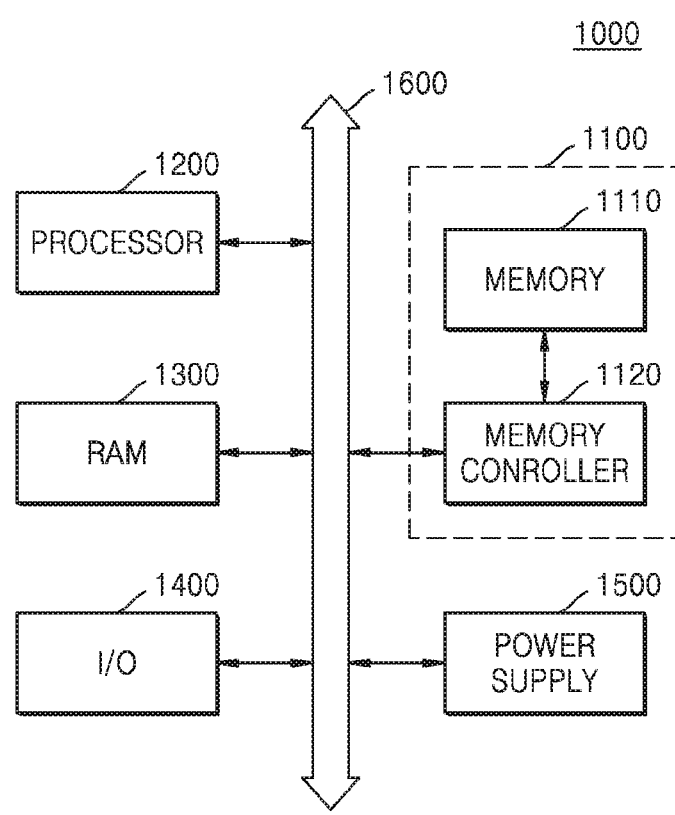
FIG. 10 is a block diagram showing a computing system including a memory device according to embodiments of inventive concepts.

FIG. 10 is a block diagram showing a computing system 1000 including a memory device, according to embodiments of inventive concepts.

Referring to FIG. 10, the computing system 1000 may include a memory system 1100, a processor 1200, a RAM 1300, an input/output device 1400, and/or a power supply 1500. The computing system 1000 may further include ports for communicating with a video card, a sound card, a memory card, a USB device, etc. for communicating with other electronic devices. The computing system 1000 may be or may include a personal computer, or may be or may include a portable electronic device such as a notebook computer, a mobile phone, a personal digital assistant (PDA), or a camera.

The processor 1200 may perform specific calculations or tasks. According to an example embodiment, the processor 1200 may be or may include a microprocessor or a central processing unit (CPU). The processor 1200 may communicate with the RAM 1300, the input/output device 1400, and the memory system 1100 through a bus 1600 such as an address bus, a control bus, or a data bus. According to an example embodiment, the processor 1200 may be connected to an expansion bus such as a peripheral component interconnect (PCI) bus.

In this regard, the memory system 1100 may be implemented by using the embodiment described above with reference to FIG. 1. For example, a memory device 1110 may include the nonvolatile memory device 100 shown in FIG. 1, and the memory device 1110 may be programmed through a programming method of a nonvolatile memory device, shown in FIGS. 5 and 6.

The RAM 1300 may store data required for an operation of the computing system 1000. For example, the RAM 1300 may be a dynamic random-access memory (DRAM), a mobile DRAM, a static RAM (SRAM), a phase-change RAM (PRAM), a ferroelectric RAM (FRAM), a resistive RAM (RRAM), and/or a magnetoresistive RAM (MRAM). The input/output device 1400 may include an input device such as a keyboard, a keypad, or a mouse, and an output device such as a printer or a display. The power supply 1500 may supply an operating voltage required for an operation of the computing system 1000.

Figure 11:
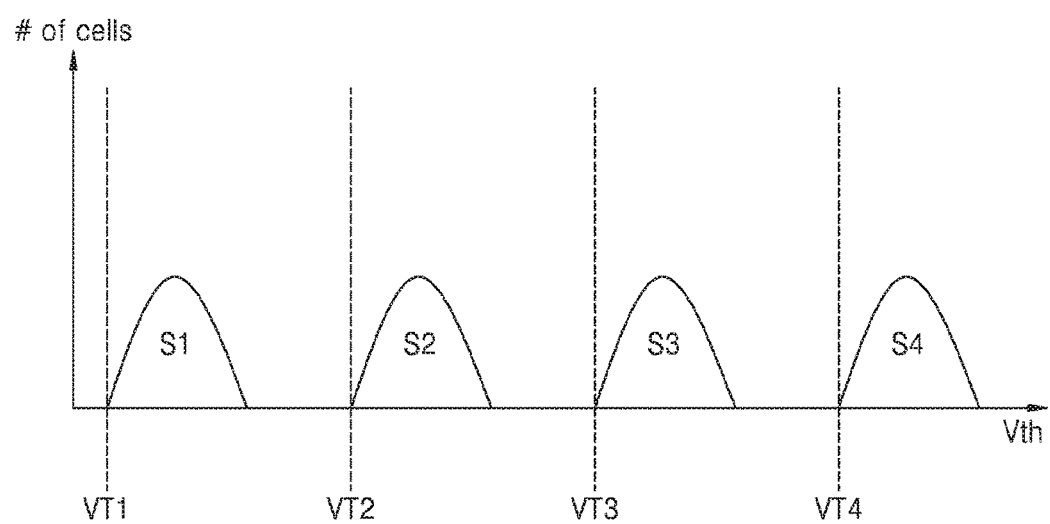
FIG. 11 is a graph showing distributions of threshold voltages around a plurality of target threshold voltages according to embodiments of inventive concepts.

FIG. 11 is a graph showing distributions of threshold voltages around a plurality of target threshold voltages according to embodiments of inventive concepts.

A plurality of memory cells may have a distribution of threshold voltages VT. A plurality of target threshold voltages VT1-VT4 may correspond to target threshold voltages of the programming states. For example, threshold voltages of memory cells S1 in a first programming state may be higher or equal to target threshold voltage VT1, threshold voltages of memory cells S2 in a second programming state may be higher or equal to target threshold voltage VT2, threshold voltages of memory cells S3 in a third programming state may be higher or equal to target threshold voltage VT3, and threshold voltages of memory cells S4 in a fourth programming state may be higher or equal to target threshold voltage VT4. Although only four programming states are shown in FIG. 11, inventive concepts are not limited thereto, and there may be more or less programming states.

While inventive concepts has been particularly shown and described with reference to embodiments thereof, it will be understood that various changes in form and details may be made therein without departing from the spirit and scope of the following claims.

What is claimed is:

1. A programming method of a nonvolatile memory device, the method comprising the steps of:
   a first programming loop including applying a first verifying voltage to word lines of a plurality of first memory cells for being programmed in a first programming state of a first target threshold voltage and detecting, based on threshold voltages from among the plurality of first memory cells, a first fast memory cell and a first slow memory cell;
   a second programming loop including applying a first program pulse to the first fast memory cell and the first slow memory cell, and applying a second program pulse to the first slow memory cell and a plurality of second memory cells, a voltage level of the second program pulse of the second program loop being greater than a voltage level of the first program pulse of the second program loop; and
   a third programming loop, and
   wherein the plurality of second memory cells have a target threshold voltage greater than the first target threshold voltage.

2. The method of claim 1, wherein the third programming loop includes applying a first program pulse to the first memory cells and applying a second program pulse to the first slow memory cell,
   the voltage level of the first program pulse of the third programming loop being greater than the voltage level of the first program pulse of the second programming loop,
   the voltage level of the second program pulse of the third programming loop being greater than the voltage level of the first program pulse of the third programming loop, and
   the voltage level of the second program pulse of the third programming loop being greater than the voltage level of the second program pulse of the second programming loop.

3. The method of claim 2, wherein a difference between the voltage level of the first program pulse of the third programming loop and the voltage level of the first program pulse of the second programming loop is greater than a difference between the voltage level of the second program pulse of the third programming loop and the voltage level of the second program pulse of the second programming loop.

4. The method of claim 2, wherein the second programming loop further includes applying a second verifying voltage greater than the first verifying voltage to word lines of a plurality of second memory cells, the plurality of second memory cells for being programmed in a second programming state of a second target threshold voltage greater than the first threshold voltage, and
   detecting, from among the plurality of second memory cells, a second slow memory cell having a threshold voltage less than the second verifying voltage.

5. The method of claim 4, further comprising:
   applying a third program pulse to the second slow memory cell in the third programming loop, a voltage level of the third program pulse being the greater of the third programming loop greater than the voltage level of the second program pulse of the third programming loop.

6. The method of claim 1, wherein the first programming loop further comprises applying the first program pulse to a plurality of memory cells having a third target threshold voltage less than the first target threshold voltage.

7. The method of claim 1, wherein the first verifying voltage is a verifying voltage in a programming state with a third target threshold voltage less than the first threshold voltage.

8. The method of claim 1, wherein the first programming loop further comprises applying a single program pulse before the applying of the first verifying voltage.

9. The method of claim 1, wherein the first target threshold voltage and a second target threshold voltage of a plurality of second memory cells are greatest target threshold voltages from among a plurality of target threshold voltages of programming states of a plurality of memory cells of the nonvolatile memory device.

10. The method of claim 1, wherein, in the second programming loop, the applying of the first program pulse is performed after the applying of the second program pulse.

11. A nonvolatile memory device comprising:
    a cell array comprising a plurality of first memory cells for being programmed in a first programming state;
    a row decoder configured to apply, in a first programming loop, a verifying voltage to word lines of the plurality of first memory cells, and apply, in at least one of a second programming loop and a third programming loop, a first program pulse of a first voltage and a second program pulse of a second voltage greater than the first voltage to the word lines of the first memory cells;
    a voltage generator configured to generate the verifying voltage, the first voltage, and the second voltage, and transmit the verifying voltage, the first voltage, and the second voltage to the row decoder;
    a page buffer configured to provide a programming inhibit voltage or a programming bit line voltage to bit lines of the first memory cells; and
    a control logic configured to control sequential execution of the first programming loop, the second programming loop, and the third programming loop,
    wherein the control logic is configured to control the voltage generator so that a difference between a first voltage of the first program pulse of the third programming loop and a first voltage of the first program pulse of the second programming loop is greater than a difference between a second voltage of the second program pulse of the third programming loop and a second voltage of the second program pulse of the second programming loop.

12. The device of claim 11, wherein the page buffer includes a plurality of data latches connected to the bit lines of the first memory cells, and
    at least one of the plurality of data latches is configured to store information regarding at least one memory cell from among the first memory cells, wherein the at least one memory cell has a threshold voltage less than the verifying voltage.

13. The device of claim 11, wherein the control logic is further configured to control the row decoder and the page buffer to provide, while the second program pulse is provided to the word lines of the first memory cells, the programming inhibit voltage to a bit line of at least one memory cell from among the first memory cells, wherein the at least one memory cell has a threshold voltage higher than the verifying voltage.

14. The device of claim 11, wherein the verifying voltage is a voltage for verifying that memory cells in the cell array are programmed in a programming state of a target threshold voltage less than a target threshold voltage of the first programming state.

15. The device of claim 11, wherein the cell array further comprises a plurality of second memory cells for being programmed in a second programming state with a target threshold voltage greater than a target threshold voltage of the first memory cells, and the control logic is further configured to control the row decoder and the page buffer to provide, while the second program pulse is provided to the word lines of the first memory cells, the programming bit line voltage to bit lines of the plurality of second memory cells.

16. A method, comprising:
applying a first verify voltage to a plurality of first memory cells having a first target threshold voltage;
applying a first program pulse of a second programming loop to a first slow memory cell of the plurality of first memory cells and a first fast memory cell of the plurality of first memory cells;
applying a second program pulse of the second programming loop to the first slow memory cell of the plurality of first memory cells and a plurality of second memory cells; and
not applying the second program pulse to the first fast memory cell, and
wherein threshold voltage of the first slow memory cell of the plurality of first memory cells is less than or equal to the first verify voltage,
wherein threshold voltage of the first fast memory cell of the plurality of first memory cells is greater than the first verify voltage, and
wherein the plurality of second memory cells have a target threshold voltage greater than the first target threshold voltage.

17. The method of claim 16, wherein a voltage of the first program pulse is less than a voltage of the second program pulse.

18. The method of claim 16, wherein the applying the first verify voltage is performed in a first programming loop before the second programming loop.

19. The method of claim 16, further comprising:
applying a second verifying voltage to a plurality of second memory cells, the second verifying voltage greater than the first verifying voltage;
applying a first program pulse of a third programming loop to the plurality of second memory cells;
applying a second program pulse of the third programming loop to the plurality of second memory cells;
applying a third program pulse of the third programming loop to a second slow memory cell of the plurality of second memory cells in response to the second verifying voltage being greater than a threshold voltage of the second slow memory cell; and
not applying the third program pulse of the third programming loop to a second fast memory cell of the plurality of second memory cells in response to the second verifying voltage being less than the threshold voltage of the second fast memory cell.

* * * * *